United States Patent [19]

Grudkowski

[11] 4,354,166
[45] Oct. 12, 1982

[54] CARRIER CONCENTRATION CONTROLLED SURFACE ACOUSTIC WAVE RESONATOR AND OSCILLATOR

[75] Inventor: Thomas W. Grudkowski, Glastonbury, Conn.

[73] Assignee: United Technologies Corporation, Hartford, Conn.

[21] Appl. No.: 199,871

[22] Filed: Oct. 23, 1980

[51] Int. Cl.³ .................... H01L 41/04; H03B 5/32; H03H 9/25; H03H 9/42
[52] U.S. Cl. .................... 331/107 A; 310/313 D; 310/366; 333/152; 333/195
[58] Field of Search .............. 331/107 A; 310/313 R, 310/313 D, 366; 333/152, 154, 195

[56] References Cited

U.S. PATENT DOCUMENTS 4,166,258  8/1979  Tseng .................................. 333/195
4,233,573 11/1980  Grudkowski .................... 331/107 A
4,249,146  2/1981  Yen et al. ...................... 331/107 A X
4,306,456 12/1981  Maerfeld ...................... 310/313 R X Primary Examiner—Siegfried H. Grimm
Attorney, Agent, or Firm—M. P. Williams

[57] ABSTRACT

A surface acoustic wave resonator formed on a semiconductive piezoelectric substrate (9) has arrays (10, 11) of reflector elements forming rectifying junctions with the substrate, a voltage is impressed between the arrays and related ohmic ground contacts (12, 13) for controlling the carrier concentration beneath the arrays so as to vary the acoustic velocity therebeneath, thereby to tune the resonator. The resonator may include two acoustoelectric transducers (16, 17) for connection with an amplifier in an oscillator loop, or may have but a single acoustoelectric transducer (20) for interconnection between the elements of an oscillator circuit (21).

3 Claims, 5 Drawing Figures

CARRIER CONCENTRATION CONTROLLED SURFACE ACOUSTIC WAVE RESONATOR AND OSCILLATOR

DESCRIPTION

1. Technical Field

This invention relates to electrically tunable surface acoustic wave reflector resonators, and more particularly to control of surface acoustic wave resonator frequency by variation of the carrier concentration in piezoelectric and semiconductive substrates of resonator reflector element arrays.

2. Background Art

Surface acoustic wave (SAW) devices are used as principal frequency control elements in oscillator circuits for a variety of purposes. In some cases, the purpose is simply to provide a small, competent device capable of being controlled so that its parameters remain essentially constant within a desired tolerance, to provide oscillator frequency control to a desired degree of accuracy. In other cases, parameters of the SAW device may be altered by a strain or other phenomenon, such as in response to force, pressure, temperature and the like, to thereby provide a phenomenon transfer which is compatible with related frequency-responsive or digital circuitry. In some cases, it is desirable to provide voltage tuning of the SAW resonator in order to change a mode, to provide temperature stability, or for trimming purposes. A voltage tunable surface acoustic wave reflective resonator is described in Cross, P. S. et al, Electronically Variable Surface-Acoustic-Wave Velocity and Tunable SAW Resonators, Applied Physics Letters, Vol. 28, No. 1, Jan. 1976, pp 1–3. The device described therein has a plurality of reflector elements disposed in arrays on either side of a tunable SAW delay line which has input and output acoustoelectric transducers spanning an interaction region that includes a tuning transducer. The substrate of that device is lithium niobate, which has a relatively high electromechanical coupling constant, yielding a theoretical maximum tuning range of 4.5%. However, the achievable tuning range is limited by the ratio of the length of the tuning transducer along the direction of wave propagation to the effective propagation length within elements of the reflector arrays. Thus, achievable tuning ranges are on the order of 1.4%.

The problem with the voltage tunable, lithium niobate SAW resonator is that it is impossible to provide such a resonator in an oscillator configuration integrally formed therewith in a monolithic fashion because the lithium niobate does not have semiconductive properties. Provision of voltage tunable devices capable of implementation on semiconductive substrates is disclosed in my commonly owned, copending U.S. patent application Ser. No. 11,612, filed on Feb. 12, 1979 and entitled *CARRIER CONCENTRATION CONTROLLED SURFACE ACOUSTIC WAVE VARIABLE DELAY DEVICES*, now U.S. Pat. No. 4,233,573. In said patent, the entirety of which is incorporated herein by reference, a voltage tunable delay line includes a segmented rectifying contact on a SAW delay line which may either be disposed on a substrate of semiconductive and piezoelectric material, or on a nonpiezoelectric semiconductive material having a piezoelectric surface layer thereon. Application of voltage to the segmented electrode to enhance carrier concentration in a semiconducting semiconductive material or to deplete carrier concentration in a semi-insulating semiconductive material alters the acoustic velocity and thus the frequency of the device. As described in said patent, such device may be used as the tuning element disposed between the reflectors of a resonator of the type disclosed in Cross et al, supra. However, because of the much lower eletromechanical coupling constant of a semiconductive piezoelectric material, or of a thin piezoelectric layer, the tuning range of such devices may be limited to a fraction of a percent. And, with the further limitation pointed out by Cross et al, supra, that the overall tuning range is limited by the fraction of cavity length that the tuning element occupies, a SAW resonator employing voltage tuning of said patent may be further limited by that fractional cavity length, which may not be adequate in many applications. Furthermore, the larger the spacing between the input and output transducers, the more modes which may be supported within the tunable resonator. Therefore, to reduce the number of modes which are supportable, the physical extent of the tuning element between the input and output transducers should be as small as possible.

DISCLOSURE OF INVENTION

Objects of the invention include provision of a carrier concentration controlled SAW resonator with improved tuning range, capable of integration with semiconductor circuits.

According to the present invention, an electrically controlled surface acoustic wave reflector resonator includes a piezoelectric and semiconductive substrate having two sets of segmented rectifying contacts disposed on opposite sides of a transducer region, each segmented contact serving as a reflector array, and a variable voltage applied to each segmented contact to control carrier concentration within the substrate, thereby to control the velocity of the SAW wave beneath the reflector elements, and therefore the resonant frequency of the resonator. According further to the present invention, the transducer region may comprise a pair of transducers which are acoustically coupled to each other for use as a series tuning element at which the frequency of lowest insertion loss is the tuning phenomenon, or having a single transducer coupled directly to the elements of an oscillator (such as in the traditional Pierce, Colpitts or Clapp configurations), such that the oscillation is at a frequency of correct phase of feedback provided through the single transducer disposed between the reflector elements of the resonator.

The invention may take a variety of forms as described in the aforementioned patent, and is readily implemented utilizing known microcircuit processing techniques, in the light of the teachings which follow herein. Other objects, features and advantages of the present invention will become more apparent in the light of the following detailed description of exemplary embodiments thereof, as illustrated in the accompanying drawings.

BEST MODE FOR CARRYING OUT THE INVENTION

Figure 1:
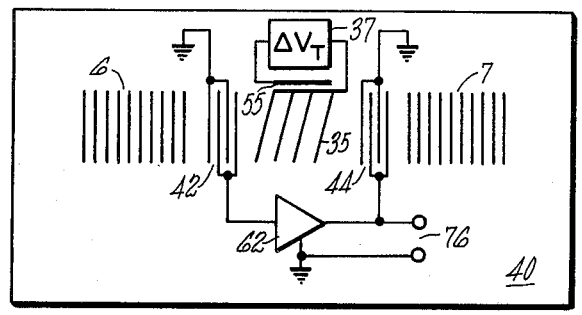
FIG. 1 is a simplified schematic diagram of a tunable resonator known to the prior art.

Referring now to FIG. 1, a tunable resonator of the general type described by Cross et al, as modified to use carrier concentration control of the type described in my aforementioned patent, includes a substrate 40 having two arrays of reflector elements 6, 7 disposed thereon on opposite sides of an interaction region which includes input and output interdigital transducers 44, 42 and a segmented rectifying contact 35, the fingers of the contact being tilted slightly, if desired, to reduce reflections. A tuning voltage is applied by a variable tuning voltage source 37 and a nearby, ohmic ground contact 55. The input transducer 44 is connected to the output of an amplifier 62 and the output transducer 42 is connected to the input of the amplifier 62. Therefore, the amplifier 62 is provided with a resonant, acoustic feedback path between the transducers 44, 42 which includes the tuning region between these transducers, in that portion of the substrate subsisting the segmented contact 35. As described in my aforementioned patent, variation of the voltage beneath the contact 35 will vary the carrier concentration in the region between the transducers 44, 42, thereby adjusting the acoustic velocity in a different manner, but for the same purpose as described in Cross et al. The semiconductive piezoelectric substrate 40 may either comprise a material which is both semiconductive and piezoelectric such as gallium arsenide, or it may comprise a non-semiconductive piezoelectric film (such as zinc oxide) on a semiconductive substrate (such as silicon). Depending upon the substrate, the variable tuning voltage of the source 37 may be selected so as to control depletion of carriers or enhancement of carrier concentration in the semiconductive material of the substrate 40, so as to selectively control the semiconducting/semi-insulating properites thereof, thereby controlling the velocity of the acoustic wave and thus the frequency of the oscillator formed by the amplifier 62 with its acoustoelectric feedback. As is known, the output may be taken at output terminals 76.

The reflector elements 6, 7 may comprise deposited aluminum, each element having a length (in the propagation direction) of a quarter wavelength, each element being spaced one-quarter wavelength from the next. Because the depletion depth of interest is on the order of a wavelength, the fingers of the segmented contact 35 may be separated by on the order of a wavelength or so, to ensure continuity of enhancement or depletion in the successive regions associated with each segment, but may be other than an odd number of wavelengths apart so as to avoid presenting apparent short circuits which could tend to reduce the difference between the potential in a substrate with the substrate nonconducting and the potential in a substrate with the substrate conducting. Although shown dirctly on the substrate 40, the tuning voltage source 37 may more commonly be formed separately; on the other hand, the invention, employing a semiconductive substrate, is readily adapted for monolithic integration with an amplifier 62, directly on the substrate 40, as shown in FIG. 1 and as further described in my aforementioned patent.

As described briefly hereinbefore, the problem with the configuration of FIG. 1 is that there must be a significant length of the tuning region beneath the contact 35 along the direction of acoustic wave propagation in order to have a significant tuning capability. And, this is particularly true where the particular piezoelectric semiconducting substrate 40 has a relatively low electromechanical coupling constant, such as gallium arsenide. This causes the transducers 42, 44 to be separated to such an extent that a large number of modes may be sustainable. These modes may include, typically, spurious side lobes, or other closely spaced cavity modes.

Figure 2:
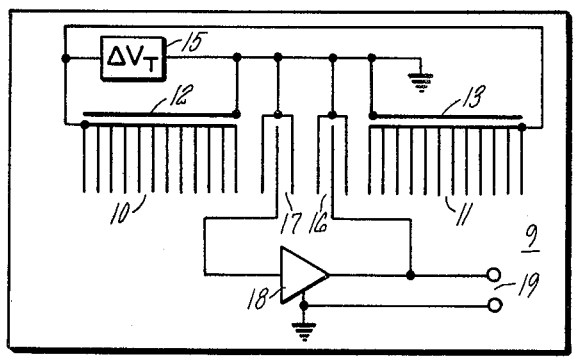
FIG. 2 is a simplified diagram of a tunable resonator in accordance with the present invention having acoustically coupled input and output ports.

Referring now to FIG. 2, a piezoelectric semiconductive substrate, which may take any of the forms described in my aforementioned patent, has a plurality of reflector elements 10, 11, formed thereon, which elements comprise rectifying junctions, such as Schottky barriers formed by depositing aluminum on the substrate 9. Associated with each of the reflector arrays 10, 11 is an ohmic ground contact 12, 13 to permit impressing a voltage, from a variable tuning voltage source 15, between the reflector elements 10, 11 and the ground contacts 12, 13, thereby to control the carrier concentration in a semiconducting or semi-insulating region of the substrate 9. An input interdigital transducer 16 and an output interdigital transducer 17 provide acoustically coupled feedback to an amplifier 18, so as to form an oscillator, the output of which may be taken at output terminals 19. The transducers may be formed in various ways as set forth in my aforementioned patent. According to the invention, the segments 10, 11 are not tilted, but rather are perfectly normal to the direction of wave propagation, thereby to provide reflective arrays on either side of the transducer region which includes the input and output transducers 16, 17. The design of the reflector elements 10, 11 and of the transducers 16, 17 may be in accordance with teachings well known in the art for surface acoustic wave reflector resonators. The difference in accordance with the invention is that tuning is achieved by adjusting the velocity throughout the acoustic region of the reflective arrays 10, 11 by carrier control concentration of the type described in my aforementioned patent. This permits having the transducers 16, 17 located immediately adjacent one another, as close as a quarter of a wavelength from each other, if desired. In the invention, the dimensions and spacing of the reflector elements in each of the arrays 10, 11 are chosen for suitable matching with the substrate for the desired design frequency, in contrast with the segmented electrode 35 of my copending patent, in which the segmented electrode is designed to provide minimal surface shorting while at the same time providing sufficient carrier concentration control. And, the arrays 10, 11 may be disposed immediately adjacent the transducers 16, 17 in accordance with well known design criteria, so that a substantial portion of the length of the cavity formed by the resonators is tunable by carrier concentration control. This provides maximum tuning, even though the preferred semiconductive piezoelectric substrate which permits integrated circuit fabrication is utilized, which has a lower inherent tuning range capability than other materials such as lithium niobate.

Figure 3:
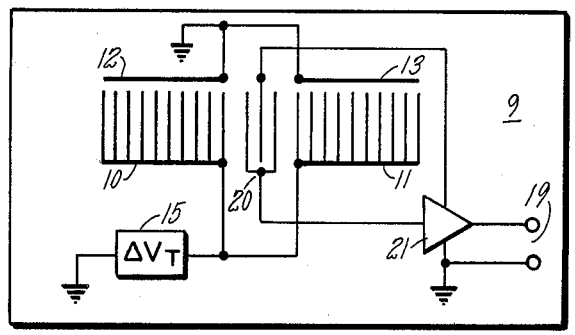
FIG. 3 is a simplified schematic diagram of a tunable resonator in accordance with the invention having but a single transducer.

In FIG. 2, the oscillator formed by the amplifier 18 and the transducer 16, 17 has its frequency controlled by an acoustic wave having a corresponding velocity at which there is minimum insertion loss in the acoustic coupling between the transducers 16, 17 in the feedback path of the oscillator. The embodiment of FIG. 3 is identical to that of FIG. 2 except that a single acoustoelectric interdigital transducer 20 is utilized to couple the resonator to an oscillator circuit 21, the resonator 20 being connected between any of the elements of the active device of the oscillator 21 (such as base to collector, collector to emitter, emitter to base, of a bipolar transistor) so as to form a Colpitts, Pierce or Clapp type of oscillator in a fashion which is well known in the art. In this case, the resonator has an acoustic wave launched therein at the frequency of oscillation of the oscillator 21, which quickly stabilizes at a frequency which has a correct phase in dependence upon the construction and tuning of the resonator.

In the embodiments of FIGS. 2 and 3, it is to be noted that the reflector elements are connected together so as to permit application of the tuning voltage thereto. It has been found that this does not materially affect the operating characteristics of a properly designed and built resonator, only a minor reduction in the resonant quality factor (Q) resulting therefrom. Also, it is immaterial whether the ohmic ground contacts 12, 13 are provided on the same side of the arrays 10, 11 as the connection of the reflector elements in each array (as in FIG. 2) or if the ohmic contacts 12, 13 are provided on the unconnected sides of the reflector elements (as in FIG. 3). On the other hand, the ohmic contacts 12, 13 may be made to the underside of the substrate if the substrate is semiconducting throughout. For instance, if a conducting n-plus-type GaAs substrate with an n-type epitaxial layer is used, the ohmic contact may preferably be made to the underside surface of the n-plus-type material. Other contact locations and methods may be used in various embodiments.

Figure 4:
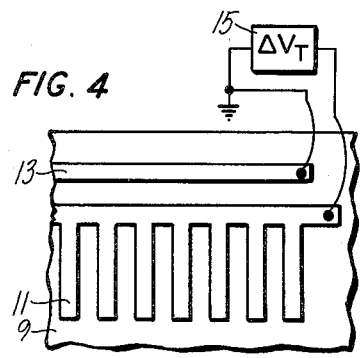
FIG. 4 is a partial plan view of tunable reflector elements in accordance with the present invention.
Figure 5:
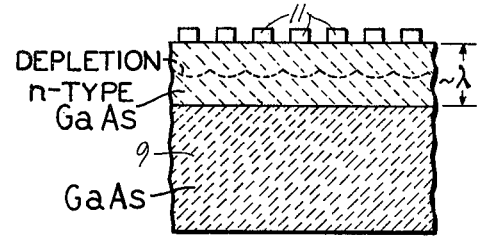
FIG. 5 is a partial, sectioned side elevation view of the portion disclosed in FIG. 4.

Referring briefly to FIG. 4, the details of a portion of the array 11 and ground contact 13 are shown. And in FIG. 5 a typical illustration of operation, similar to that disclosed in FIG. 6 of the aforementioned patent, is given for the case of an n-type gallium arsenide epitaxial substrate in which the tuning voltage applied to the elements of the reflector array 11 causes depletion of carriers, shown by the dotted line, in dependence on the magnitude of the voltage.

The present invention permits voltage tuning of a SAW reflective resonator formed on a semiconductive substrate, and thus compatible with the formation of integrated circuits directly on the same substrate therewith. The invention may be practiced in all of the variety of forms described in my aforementioned patent, insofar as formation of the reflector elements and the types of substrates are involved, as well as the depletion and enhancement modes described therein. However, the rectifying contacts in all cases in the present invention are preferably formed by deposition of aluminum, or other suitable metal, in reflector arrays 10, 11 as described hereinbefore.

Although the invention has been shown and described with respect to exemplary embodiments thereof, it should be understood by those skilled in the art that the foregoing and various other changes, omissions and additions in the form and detail thereof may be made therein and thereto, without departing from the spirit and the scope of the invention.

I claim:

1. An improved carrier concentration controlled, surface acoustic wave, variable reflector resonator comprising:
   a piezoelectric and semiconductive substrate;
   a pair of arrays of reflector elements disposed on opposite sides of a transducer region on a surface of said substrate; and
   an acoustoelectric transducer disposed on said surface of said substrate between said reflector arrays; characterized by:
   the reflector elements in each of said arrays being connected together and forming a segmented rectifying contact with said substrate;
   an ohmic connection to said substrate formed near each of the reflective elements of each of said arrays; and
   means for impressing variable voltage between said reflector arrays and said ohmic contacts for altering the concentration of carriers beneath and between said reflector elements, whereby variations in said voltage alter the potential and velocity of the surface acoustic wave at the surface of said substrate, thereby to control the resonant frequency of said resonator.

2. A resonator according to claim 1 further characterized by said acoustoelectric transducers being connected between a pair of elements of an oscillator to provide phase control tuning thereof.

3. A resonator according to claim 1 including a second acoustoelectric transducer disposed in said transducer region between said first named transducer and one of said reflector arrays, said transducers being respectively connected to the input and the output of an amplifier so as to form an oscillator circuit.

* * * * *